(12) United States Patent
Kim et al.

(10) Patent No.: US 10,205,051 B2
(45) Date of Patent: *Feb. 12, 2019

(54) BAR LIKE LIGHT EMITTING DEVICE AND MANUFACTURING METHOD OF THE SAME

(71) Applicant: SAMSUNG DISPLAY CO., LTD., Yongin-si, Gyeonggi-do (KR)

(72) Inventors: Jung Hyun Kim, Yongin-si (KR); Hyun Min Cho, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/855,502

(22) Filed: Dec. 27, 2017

(65) Prior Publication Data
US 2018/0198018 A1    Jul. 12, 2018

(30) Foreign Application Priority Data
Jan. 9, 2017 (KR) .................. 10-2017-0002907

(51) Int. Cl.
| | |
|---|---|
| H01L 33/00 | (2010.01) |
| H01L 27/15 | (2006.01) |
| H01L 33/06 | (2010.01) |
| H01L 33/08 | (2010.01) |
| H01L 33/44 | (2010.01) |
| H01L 33/56 | (2010.01) |
| H01L 33/62 | (2010.01) |
| H01L 33/38 | (2010.01) |

(52) U.S. Cl.
CPC ........ *H01L 33/0095* (2013.01); *H01L 27/156* (2013.01); *H01L 33/06* (2013.01); *H01L 33/08* (2013.01); *H01L 33/387* (2013.01); *H01L 33/44* (2013.01); *H01L 33/56* (2013.01); *H01L 33/62* (2013.01); *H01L 2933/0016* (2013.01); *H01L 2933/0025* (2013.01)

(58) Field of Classification Search
CPC ..... H01L 33/36; H01L 27/153; H01L 27/156; H01B 33/10
See application file for complete search history.

(56) References Cited

U.S. PATENT DOCUMENTS

| | | | |
|---|---|---|---|
| 9,112,112 B2 * | 8/2015 | Do ........................ | H01L 33/0095 |
| 2007/0224713 A1 * | 9/2007 | Han ........................ | H01L 24/95 |
| | | | 438/26 |
| 2013/0027623 A1 * | 1/2013 | Negishi ............... | H01L 25/0753 |
| | | | 349/42 |

* cited by examiner

*Primary Examiner* — Ermias Woldegeorgis
(74) *Attorney, Agent, or Firm* — Innovation Counsel LLP (57) ABSTRACT

A light emitting device includes: a substrate; a first electrode disposed on the substrate; a first insulating layer disposed on the substrate to be spaced apart from the first electrode, the first insulating layer having a first height; a second electrode disposed on the first insulating layer; and a bar type LED disposed on the substrate, wherein the bar type LED has a first end and a second end in the length direction thereof, one of the first end and the second end is connected to the first electrode, and the other of the first end and the second end is connected to the second electrode.

20 Claims, 6 Drawing Sheets

BAR LIKE LIGHT EMITTING DEVICE AND MANUFACTURING METHOD OF THE SAME

RELATED APPLICATIONS

The present application claims priority to Korean Patent Application No. 10-2017-0002907, filed on Jan. 9, 2017, in the Korean intellectual Property Office, the entire disclosure of which is incorporated by reference herein.

BACKGROUND

1. Field

An aspect of the present disclosure relates to a light emitting device and a manufacturing method of the same.

2. Description of the Related Art

Light emitting diodes (hereinafter, referred to as LEDs) exhibit relatively satisfactory durability even in poor environmental conditions and have excellent performance in terms of lifespan and luminance. Recently, studies for applying such LEDs to various light emitting devices have been actively conducted.

As a part of such studies, there has been a technique for fabricating a micro bar type LED that is small to a degree of micro or nano scale using an inorganic crystal structure, e.g., a structure in which a nitride based semiconductor is grown. For example, the bar type LED may be fabricated in a size small enough to constitute a pixel of a self-luminescent display panel, and the like.

SUMMARY

Embodiments provide a light emitting device capable of improving light emission efficiency and a manufacturing method of the light emitting device.

According to an aspect of the present disclosure, there is provided a light emitting device including: a substrate; a first electrode disposed on the substrate; a first insulating layer disposed on the substrate to be spaced apart from the first electrode, the first insulating layer having a first height; a second electrode disposed on the first insulating layer; and a bar type LED disposed on the substrate, wherein the bar type LED has a first end and a second end in the length direction thereof, one of the first end and to the second end is connected to the first electrode, and the other of the first end and the second end is connected to the second electrode.

The light emitting device may further include a second insulating layer disposed over the first electrode. The second insulating layer may have an area smaller than that of the first electrode in a plan view.

The first electrode has a first width and the second insulating layer has a second width narrower than the first width.

When assuming that, in a plan view, the distance between the first electrode and the second electrode is a first distance and the distance between the second electrode and the second insulating layer is a second distance, the length of the bar type LED may be longer than the first distance and be shorter than the second distance.

The length direction of the bar type LED may be disposed obliquely to one surface of the substrate.

In a plan view, the first electrode and the second electrode may have stripe shapes, and be alternatingly disposed to be spaced apart from each other. Alternatively, in a plan view, the first electrode and the second electrode may have ring shapes having concentric circles, and be disposed to be spaced apart from each other.

The light emitting device may further include an encapsulation layer disposed on the substrate to fix the bar type LED.

The light emitting device may further include: a gate line disposed on the substrate, the gate line extending in a first direction; a data line disposed on the substrate, the data line extending in a second direction intersecting the first direction; a first power line extending in the first direction or the second direction; and a thin film transistor connected to the gate line, the data line, and the first power line. A drain electrode of the thin film transistor may be connected to one of the first electrode and the second electrode.

The light emitting device may further include a second power line connected to the other of the first electrode and the second electrode, the second power line extending in the second direction.

The second power line may be disposed on the same layer as the data line, and include the same material as the data line.

The light emitting device may further include a second power line connected to the other of the first electrode and the second electrode, the second power line extending in the first direction.

The second power line may be disposed on the same layer as the gate line, and include the material as the gate line.

The light emitting device may further include a second power line connected to the the other of the first electrode and the second electrode, the second power line extending in the first direction of the second direction. The second power line may be disposed on the same layer as the semiconductor pattern, and include the same material as the semiconductor pattern.

The thin film transistor may include: the thin film transistor includes: a semiconductor pattern disposed on the substrate; a gate electrode disposed on the semiconductor pattern; and source and drain electrodes disposed on the gate electrode, the source and drain electrodes each being connected to the semiconductor pattern. The first electrode may be connected to the drain electrode.

According to an aspect of the present disclosure, there is provided a light emitting device including: a first electrode disposed provided on a substrate, a first insulating layer spaced apart from the first electrode in a plan view, a second insulating layer disposed over the first electrode, a second electrode disposed on the first insulating layer, and bar type LEDs scattered on the substrate.

According to an aspect of the present disclosure, there is provided a method of manufacturing a light emitting device, the method including: forming a first electrode on a substrate; forming a first insulating layer spaced apart from the first electrode in a plan view; a second insulating layer disposed over the first electrode; a second electrode disposed on the first insulating layer; applying an electric field between the first electrode and the second electrode; and scattering bar type LEDs on the substrate.

The first insulating layer and the second insulating layer may be formed in a single process.

The applying of the electric field and the scattering of the bar type LEDs may be simultaneously performed.

The method may further include forming an encapsulation layer disposed on the substrate to fix the bar type LEDs.

The method may further include forming a gate line, a data line, a first power line, a second power line, and a thin film transistor on the substrate before the first electrode is formed in the manufacturing of the light emitting device.

BRIEF DESCRIPTION OF THE DRAWINGS

Example embodiments will now be described more fully hereinafter with reference to the accompanying drawings.

however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The present disclosure may apply various changes and different shape, therefore only illustrate in details with particular examples. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, exemplary embodiments of the present disclosure will be described in detail with reference to the accompanying drawings.

A light emitting device according to an embodiment of the present disclosure includes a bar type light emitting diode (LED).

Figure 1:
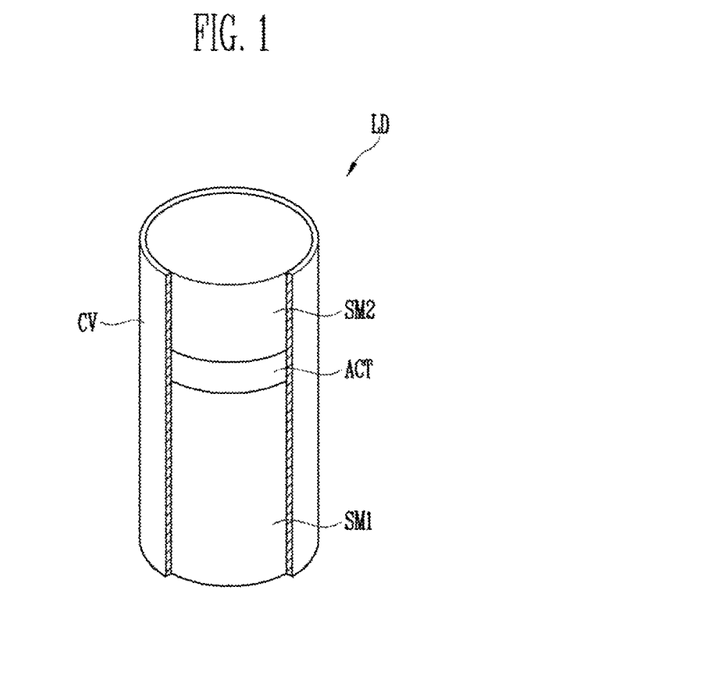
FIG 1. is a perspective view illustrating a bar type LED according to an embodiment of the present disclosure.

FIG. 1 is a perspective view illustrating a bar type LED according to an embodiment of the present disclosure. In FIG. 1, a cylindrical bar type LED LD is illustrated, but the present disclosure is not limited thereto.

Referring to FIG. 1, the bar type LED according to the embodiment of the present disclosure includes first and second conductive semiconductor layers SM1 and SM2 and an active layer ACT interposed between the first and second conductive semiconductor layers SM1 and SM2. For example, the bar type LED may be implemented as a stack structure in which the first conductive semiconductor layer SM1, the active layer ACT, and the second conductive semiconductor layer SM2 are sequentially stacked.

According to an embodiment of the present disclosure, the bar type LED LD may be formed in a bar shape extending along one direction. In an embodiment of the present disclosure, the bar type LED LD may be a cylindrical shape as disclosed in FIG. 1. However, the term "bar type" may include a rod-like shape or a bar-like shape, which is long in its length direction (i.e., an aspect ratio is greater than 1), such as a cylinder or a polyprism.

When assuming that the extending direction of the bar type LED LD is a length direction, the bar type LED LD may have a first end and a second end along the extending direction. In an embodiment of the present disclosure, one of the first and second conductive semiconductor layers SM1 and SM2 may be disposed at the first end, and the other of the first and second conductive semiconductor layers SM1 and SM2 may be disposed at the second end.

The bar type LED LD may be manufactured small enough to have a diameter and/or a length for example, to a degree of micro or nano scale. However, the size of the bar type LED LD according to the embodiment of the present disclosure is not limited thereto, and may be changed to correspond to required conditions of a light emitting device to which the bar type LED LD is applied.

The first conductive semiconductor layer SM1 may include, for example, at least one n-type semiconductor layer. For example, the first conductive semiconductor layer SM1 may include at least one semiconductor material selected from InAlGaN, GaN, AlGaN, InGaN, AlN, and InN, and include a semiconductor layer doped with a first conductive dopant such as Si, Ge, or Sn. The material constituting the first conductive semiconductor layer SM1 is not limited thereto, and various materials may be included in the first conductive semiconductor layer SM1.

The active layer ACT is formed on the first conductive semiconductor layer SM1, and may be formed in a single or multiple quantum well structure. According to an embodiment of the present disclosure, a clad layer (not shown) doped with a conductive dopant may be formed on the top and/or bottom of the active layer ACT. For example, the clad layer may be implemented as an AlGaN layer or InAlGaN layer. In addition, it will be apparent that a material such as AlGaN or AlInGaN may also be used for the active layer ACT. If an electric field having a predetermined voltage or more is applied to both ends of the bar type LED LD, the bar type LED LD emits light as electron-hole pairs are combined in the active layer ACT.

The second conductive semiconductor layer SM2 is formed on the active layer ACT, and may include a semiconductor layer having a type different from that of the first conductive semiconductor layer SM1. For example, the second conductive semiconductor layer SM2 may include at least one p-type semiconductor layer. For example, the second conductive semiconductor layer SM2 may include at least one semiconductor material selected from InAlGaN, GaN, AlGaN, InGaN, AlN, and InN, and include a semiconductor layer doped with a second conductive dopant such is Mg. The material constituting the second conductive semiconductor layer SM2 is not limited thereto, and various materials may be included in the second conductive semiconductor layer SM2.

According to an embodiment of the present disclosure, in addition to the first conductive semiconductor layer SM1, the active layer ACT, and the second conductive layer SM2, which are described above, the bar type LED LD may further include a phosphor layer, an active layer, a semiconductor layer, and/or an electrode layer, which are formed on the top and/or bottom of each layer. Also, the bar type LED LD may further include an insulative film CV. For convenience of description, a state in which a portion of the insulative film CV is removed is illustrated in FIG. 1.

However, according to an embodiment of the present disclosure, the insulative film CV may be omitted, and be provided to cover only portions of the first conductive semiconductor layer SM1, the active layer ACT, and the second conductive semiconductor layer SM2. For example, the insulative film CV may be formed to cover the bar type LED LD except both end side portions of the bar type LED LD. In an embodiment of the present disclosure, when the both end side portions of the bar type LED LD which correspond to the first conductive semiconductor layer SM1 and the second conductive semiconductor layer SM2 are exposed to the outside, the contact area of the both end side portions with other components (e.g., electrodes) is widened, so that electrical connection between the both end side portions with the other components can be easily performed.

According to an embodiment of the present disclosure, the insulative film CV may include a transparent insulating material. For example, the insulative film CV may include at least one insulating material selected from the group consisting of $SiO_2$, $Si_3N_4$, $Al_2O_3$, and $TiO_2$. However, the present disclosure is not limited thereto, and various materials having insulating properties may be used.

In an embodiment of the present disclosure, the insulative film CV itself may be made of a hydrophobic material, or a hydrophobic film made of a hydrophobic material may be further provided on the insulative film CV to cover the insulative film CV. The hydrophobic material may be a material containing fluorine to exhibit hydrophobicity. The hydrophobic material may be applied in the form of a self-assembled monolayer (SAM) to the bar type LED LD. In this case, the hydrophobic material may include octadecyltrichlorosilane, fluoroalkyltrichlorosilane, perfluoroalkyltriethoxysilane, and the like. In addition, the hydrophobic material may be a commercialized fluorine-containing material such as Teflon™ or Cytop™, or a material corresponding thereto.

If the insulative film CV is provided in the bar type LED LD, it is possible to prevent the active layer ACT from being short-circuited with a first electrode (not shown) and/or a second electrode (not shown). Further, as the insulative film CV is formed, it is possible to minimize a surface defect of the bar type LED LD, thereby improving lifespan and efficiency of the bar type LED LD. Furthermore, even when a plurality of bar type LEDs LD are densely arranged, the insulative film CV can prevent an undesired short circuit that may occur between the bar type LEDs LD.

The above-described bar type LED LD may be used as a light emitting source for various light emitting devices. For example, the bar type LED LD may be used as a light emitting source for lighting devices of self-luminescent display devices.

Figure 2:
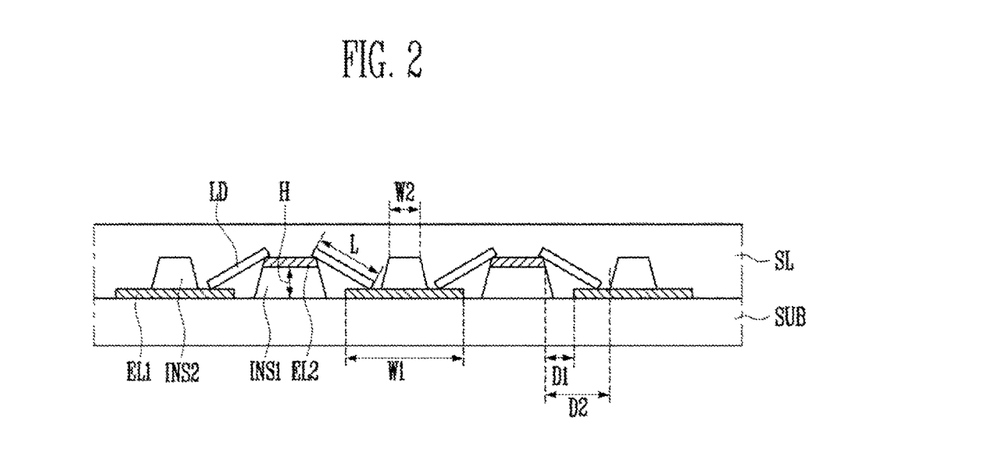
FIG. 2 is a structural diagram illustrating a light emitting device according to an embodiment of the present disclosure.

FIG. 2 is a structural diagram illustrating a light emitting device according to an embodiment of the present disclosure. According to an embodiment of the present disclosure, a display device is illustrated as a light emitting device using a bar type LED LD as a light source, but the light emitting device according to the present disclosure is not limited to the display device. For example, the light emitting device according to the present disclosure may be a different type of light emitting device such as a lighting device.

Referring to FIG. 2, the light emitting device according to the embodiment of the present disclosure includes a substrate SUB, a first electrode EL1 disposed on the substrate SUB, a second insulating layer INS2 disposed on the substrate SUB, a first insulating layer INS1 that is disposed to be spaced apart from the first electrode EL1 and has a predetermined height H, a second electrode EL2 disposed on the first insulating layer INS, and a bar type LED LD disposed on the substrate SUB.

The substrate SUB may be provided in various planar shapes and be made of an insulative material.

The first electrode EL1 is provided on the substrate SUB.

In the embodiment of the present disclosure, it has been illustrated that the first electrode EL1 is directly formed on the substrate SUB, but the present disclosure is not limited thereto. Components for allowing the light emitting device to be driven in a passive matrix manner or an active matrix manner may be further provided between the first electrode EL1 and the substrate SUB. For example, when the light emitting device is driven in the active matrix manner, signal lines, an additional insulating layer, and/or a thin film transistor may be provided between the first electrode EL1 and the substrate SUB. The signal lines may include a gate line, a data line, a power line, and the like. The thin film transistor is connected to the signal lines, and may include a gate electrode, an active pattern, a source electrode, and a drain electrode. The drain electrode may be connected to the first electrode EL1, and a signal from the data line may be applied to they first electrode EL1 through the thin film transistor. Here, it will be apparent that the signal lines, the insulating layer, and/or the thin film transistor may be provided in various numbers and shapes.

The first electrode EL1 is made of a conductive material. The conductive material may include a metal such as Ag, Mg, Al, Pt, Pd, Au, Ni, Nd, Ir, Cr, or an alloy thereof, a conductive oxide such as indium tin oxide (ITO), indium zinc oxide (IZO), zinc oxide (ZnO), or indium tin zinc oxide (ITZO), a conductive polymer such as PEDOT, and the like. In addition, the first electrode EL1 may be formed in a single layer, but the present disclosure is not limited thereto. For example, the first electrode EL1 may be formed in a multi-layer in which two or more materials among metals, alloys, conductive oxides, and conductive polymers are stacked.

The first insulating layer INS1 is disposed on the substrate SUB and is disposed at a position at which the second electrode EL2 which will be described later is to be provided. Accordingly, in a plan view, the shape of the first insulating layer INS1 may substantially correspond to that of the second electrode EL2.

The first insulating layer INS1 is spaced apart from the first electrode EL1 in a plan view, and accordingly, the first insulating layer INS1 and the first electrode EL1 do not overlap with each other in a plan view. The first insulating layer INS1 has the predetermined height H from a surface of the substrate SUB. The height H of the first insulating layer INS1 has a value smaller than the length L of the bar type LED LD.

The first insulating layer INS1 may be made of an organic material or an inorganic material. The inorganic material may include at least one of silicon oxide and silicon nitride, but the present disclosure is not limited thereto. In addition, the organic material may have photosensitivity. For example the organic material may be configured as a polymer of a monomer including an acrylate group, a methacrylate group, an epoxy group, an oxetane group, a vinyl-ether group, a styrene group, etc. In an embodiment of the present disclosure, the organic material may include at least one of polyacrylate resin, epoxy resin, phenolic resin, polyamide resin, polyimide resin, unsaturated polyester resin, polyphenylene ether resin, polyphenylene sulfide resin, and benzocyclobutene resin, but the present disclosure is not limited thereto.

The second insulating layer INS2 is provided on the first electrode EL1. In a plan view, the second insulating layer INS2 has a shape corresponding to the first electrode EL1. In this case, the second insulating layer INS2 has an area smaller than that of the first electrode EL1. In an embodiment of the present disclosure, when assuming that, in a plan view, the width of the first electrode EL1 is a first width W1 and the width of the second insulating layer INS2 is a second width W2, the first width W1 has a value greater than that of the second width W2. Accordingly, in a plan view, the second insulating layer INS2 is located on the first electrode EL1, and completely overlaps with a portion of the first electrode EL1.

Like the first insulating layer INS1, the second insulating layer INS1 may be made of an organic material or an inorganic material. In an embodiment of the present disclosure, the material of the second insulating layer INS2 may be identical to or different from that of the first insulating layer INS1. When the first insulating layer INS1 and the second insulating layer INS2 are manufactured through the same process, the first insulating layer INS1 and the second insulating layer INS2 may be made of the same material.

The second electrode EL2 is disposed on the first insulating layer INS1. In a plan view, the second electrode EL2 is spaced apart from the first electrode EL1 and the second insulating layer INS2. The second electrode EL2 may cover a top surface of the first insulating layer INS1, and the second electrode EL2 and the second insulating layer INS2 may be arranged to have the substantially same area and the substantially same shape. That is, the second electrode EL2 and the first insulating layer INS1 may completely overlap with each other.

The second electrode EL2 is also made of a conductive material. The conductive material may include a metal such as Ag, Mg, Al, Pt, Pd, Au, Ni, Nd, Ir, Cr, or an alloy thereof, a conductive oxide such as indium tin oxide (ITO), indium zinc oxide (IZO), zinc oxide (ZnO), or indium tin zinc oxide (ITZO), a conductive polymer such as PEDOT, and the like. In addition, the second electrode EL2 may be formed in a single layer, but the present disclosure is not limited thereto. For example, the second electrode EL2 may be formed in a multi-layer in which two or more materials among metals, alloys, conductive oxides, and conductive polymers are stacked.

In an embodiment of the present disclosure, distances among the first electrode EL1, the second electrode EL2, the first insulating layer INS1, and the second insulating layer INS2 are set by considering the length L of the bar type LED LD. When assuming that, when viewed on a section, the distance between the first electrode EL1 and the second electrode EL2 is a first distance D1 and the distance between the second insulating layer INS2 and the second electrode EL2 is a second distance D2, the first distance D1 is set shorter than the length L of the bar type LED LD, and the second distance D2 is set longer than the length L of the bar type LED LD. Here, the first electrode EL1 is disposed on the substrate SUB, and the second electrode EL2 is disposed on the first insulating layer INS1 having the predetermined height H. Therefore, when viewed on a section, the second electrode EL2 is located higher than the first electrode EL1. According to the above-described electrode structure, the bar-type LED LD may be disposed obliquely when the bar-type LED LD is disposed between the first electrode EL1 and the second electrode EL2.

The bar type LED LD is provided on the surface of the substrate SUB, on which the first electrode EL1 and the second electrode EL2 are disposed. One end of the bar type LED LD is located on the first electrode EL1, and the other end of the bar type LED LD is located on the second electrode EL2. The bar type LED LD has a first end and a second end in the length direction thereof. One of the first end and the second end is disposed on the first electrode EL1, and the other of the first end and the second end is disposed on the second electrode EL2. For example, the first end is physically and electrically connected to the first electrode EL1 as a first conductive semiconductor layer of the first end is in contact with the first electrode EL1, and the second end is physically and electrically connected to the second electrode EL2 as a second conductive semiconductor layer of the second end is in contact with the second electrode EL2.

Here, since the first electrode EL1 and the second electrode EL2 have a height different of the height H which corresponds to a height of the first insulating layer INS1, the bar type LED LD is disposed obliquely to the surface of the substrate SUB. That is, in the bar type LED LD, when assuming that the line that passes through the center of the bar type LED LD and is parallel to the extending direction of the bar type LED LD is an extending axis, the extending axis is oblique to the top surface of the substrate SUB. As a result, one of the first end and the second end is in contact with the first electrode EL1, and the other of the first and second ends is in contact with the second electrode EL2. For example, a first conductive semiconductor layer of the bar type LED LD is in contact with the first electrode EL1, and a second conductive semiconductor layer of the bar type LED LD is in contact with the second electrode EL2. Alternatively, the second conductive semiconductor layer of the bar type LED LD is in contact with the first electrode EL1, and the first conductive semiconductor layer of the bar type LED LD is in contact with the second electrode EL2.

Accordingly, the first conductive semiconductor layer SM1 and the second conductive semiconductor layer SM2 (see FIG. 1) of the bar type LED LD may be applied with a predetermined voltage through the first electrode EL1 and the second electrode EL2. if an electric field having a predetermined voltage or more is applied to both the ends of the bar type LED LD, i.e., both of the first end and the second end, the bar type LED LD emits light as electron-hole pairs are combined in the active layer ACT. The light emitted from the bar type LED LD is emitted in the length direction of the bar type LED LD.

An encapsulation layer SL for fixing the bar type LED LD on the substrate SUB is provided over the bar type LED LD. The encapsulation layer SL may be made of a transparent material, and include an organic polymer. For example, the encapsulation layer SL may include at least one of polyacrylate resin, epoxy resin, phenolic resin, polyamide resin, polyimide resin, unsaturated polyester resin, polyphenylene ether resin, polyphenylene sulfide resin, and benzocyclobutene resin.

The encapsulation layer SL may be formed by covering the bar type LED LD using a material having low viscosity, e.g., a pre-cured polymer material, a semi-cured polymer material, or the like, and then curing the polymer material.

As described above, in the light emitting device according to the embodiment of the present disclosure, since the bar type LED LD is disposed obliquely to the top surface of the substrate SUB, the bar type LED LD can emit light in an oblique direction of the substrate SUB. Accordingly, light can be emitted in the direction of a top surface and a bottom surface of the substrate SUB. In an embodiment of the present disclosure, the light emitting device may emit light in the direction of the top and bottom thereof. Accordingly, the light emitting device may be used as a top-emission type display device or a bottom-emission type display device.

In an embodiment of the present disclosure, the first electrode EL1 and the second electrode EL2 may be provided in various shapes.

Figure 3A:
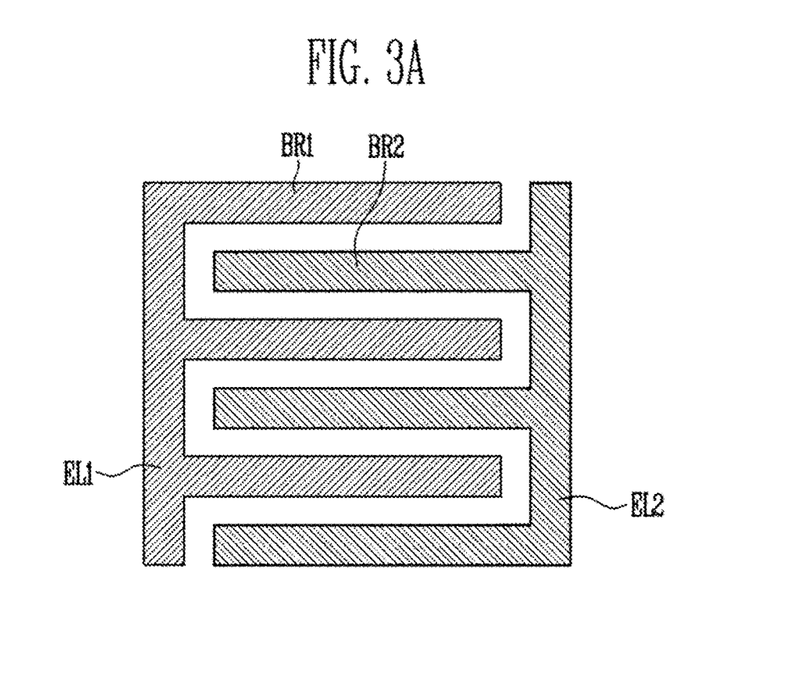
FIGS. 3A and 3B are plan views illustrating shapes of a first electrode and a second electrode according to embodiments of the present disclosure.
Figure 3B:
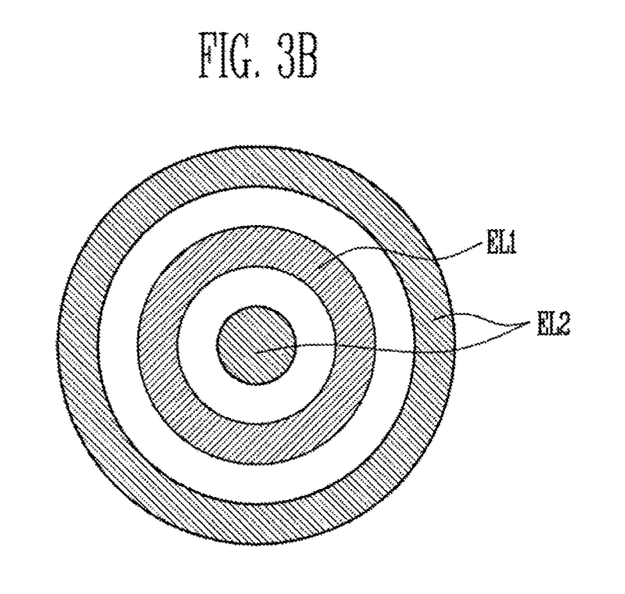

FIGS. 3A and 3B are plan views illustrating shapes of the first electrode EL1 and the second electrode EL2 according to embodiments of the present disclosure.

Referring to FIG. 3A, in an embodiment of the present disclosure, in a plan view, the first electrode EL1 and the second electrode EL2 have stripe shapes, and are disposed to be spaced apart from each other. To this end, the first electrode EL1 may have a plurality of first branches BR1 spaced apart from each other. The first branches BR1 may extend in one direction, and be arranged in another direction intersecting the one direction. At least a portion of each of the first branches BR1 may be connected to adjacent branches. In addition, the second electrode EL2 may have a plurality of second branches BR2 spaced apart from each other. The second branches BR2 may extend in the one direction, and be arranged in another direction intersecting the one direction. At least a portion of each of the second branches BR2 may be connected to adjacent branches. The first branches BR1 of the first electrode EL1 and the second branches BR2 of the second electrode EL2 may be alternately disposed along the another direction.

However, the shape of the first electrode EL1 and the second electrode EL2 is not limited thereto, and the first electrode EL1 and the second electrode EL2 may have various shapes. For example, shapes or extending directions of the first and second branches BR1 and BR2 of the first and second electrodes EL1 and EL2 may be differently set. If assuming that the first electrode EL1 and the second electrode EL2 adjacent to each other constitute one set of electrode, when the set is provided in plural numbers, extending directions of branches of the respective sets may be different from each other. In this case, since the bar type LED LD is disposed in various directions, the bar type LED LD can emit uniform light in any direction.

Referring to FIG. 3B, in a plan view, the first electrode EL1 and the second electrode EL2 may have ring shapes having concentric circles, and be disposed to be spaced apart from each other. When the first electrode EL1 and the second electrode EL2 are disposed along the concentric circle, the bar type LED LD may be radially arranged with respect to the center of the concentric circle. Accordingly, the bar type LED LD can emit uniform light in any direction.

Again, a manufacturing method of the light emitting device having the above-described structure will be described with reference to FIG. 2.

First, a first electrode EL1 is formed on a substrate SUB. The first electrode EL1 may be formed using various methods. For example, the first electrode EL1 may be formed by applying or depositing conductive materials and then performing photolithography.

Next, a first insulating layer INS1 and a second insulating layer INS2 are formed on the substrate SUB having the first electrode EL1 formed thereon. The first insulating layer INS1 is formed in a region in which the first electrode. EL1 is not provided, and the second insulating layer INS2 is formed in a region in which the first electrode EL1 is provided. The first insulating layer INS1 and the second insulating layer INS2 may be formed by using separate processes, e.g., by performing photolithography plural times using different masks. However, the present disclosure is not limited thereto, and the first insulating layer INS1 and the second insulating layer INS2 may be simultaneously formed through a single process using one mask.

A second electrode EL2 may be formed on the first insulating layer INS1. The second electrode EL2 may also be formed using various methods. For example, the second electrode EL2 may be formed by applying or depositing conductive materials and then performing photolithography.

In an embodiment of the present disclosure, the first insulating layer INS1 and the second electrode EL2 may be formed by using separate processes, e.g., by performing photolithography plural times using different masks. However, the present disclosure is not limited thereto, and the first insulating layer INS1 and the second electrode EL2 may be simultaneously formed through a single process using one mask.

The first insulating layer INS1, the second insulating layer INS2 and the second electrode may be formed using a single mask for example, a two-tone mask or a slit mask. To form the first insulating layer INS1, the second insulating layer INS2 and the second electrode using a single mask, the first insulating layer and the second insulating layer forming material and the second electrode forming material is formed on the first electrode EL1, a photo resistor layer is formed on the second electrode forming material, the photo resistor is exposed using the two-tone mask or the slit mask then developed to form a patterned photo resist layer having a first thickness on a second insulating layer forming region and a second thickness thicker than the first thickness on a first insulating layer forming region, the second electrode forming material and the first insulating layer and the second insulating layer forming material which is not covered by the patterned photo resist layer are removed, the patterned photo resist layer disposed on the second insulating layer forming region is removed, the second electrode forming material disposed on the second insulating layer forming region is removed, and the patterned photo resist layer is removed.

Next, a voltage is applied to the first electrode EL1 and the second electrode EL2, and accordingly, an electric field is formed between the first electrode EL1 and the second electrode EL2.

A bar type LED LD is disposed on the substrate SUB in the state in which the electric field is applied between the first electrode EL1 and the second electrode EL2. As a non-restrictive example related to a technique of disposing the bar type LED LD, an inkjet printing technique may be used. For example, bar type LEDs LD may be disposed on the substrate SUB by disposing a nozzle above a corresponding substrate SUB and dropping a solution including the bar type LEDs LD. According to an embodiment of the present disclosure, the solution may have an ink or paste phase. However, the technique of disposing the bar type LED LD on the substrate SUB is not limited thereto, and may be altered. After that, a solvent contained in the solution may be removed.

When the bar type LED LD is disposed, self-alignment of the bar type LED LD is performed because the electric field is formed between the first electrode EL1 and the second electrode EL2. That is, according to an embodiment of the present disclosure, the self-alignment of the bar type LED LD may be performed as a DC or AC voltage is applied to the first and second electrodes EL1 and EL2. More specifically, if a voltage is applied to the first and second electrodes EL1 and EL2, the bar type LED LD is aligned according to the applied voltage by the electric field formed between the first and second electrodes EL1 and EL2. Accordingly, the bar type LED LD is self-aligned between the first and second electrodes EL1 and EL2. The difference in height between the first and second electrodes EL1 and EL2 forms an electric field vertical or oblique to the top surface of the substrate SUB, and the bar type LED LD is self-aligned along the electric field.

After that, an encapsulation layer SL is formed on the substrate SUB on the bar type LEDs LD are scattered. The encapsulation layer SL may be formed by covering the bar type LEDs LD using a material having low viscosity, e.g., a pre-cured polymer material, a semi-cured polymer material, or the like, and then curing the polymer material.

The above-described light emitting device may be used for various types of light emitting sources. In particular, the light emitting device may be used as a display device.

Figure 4:
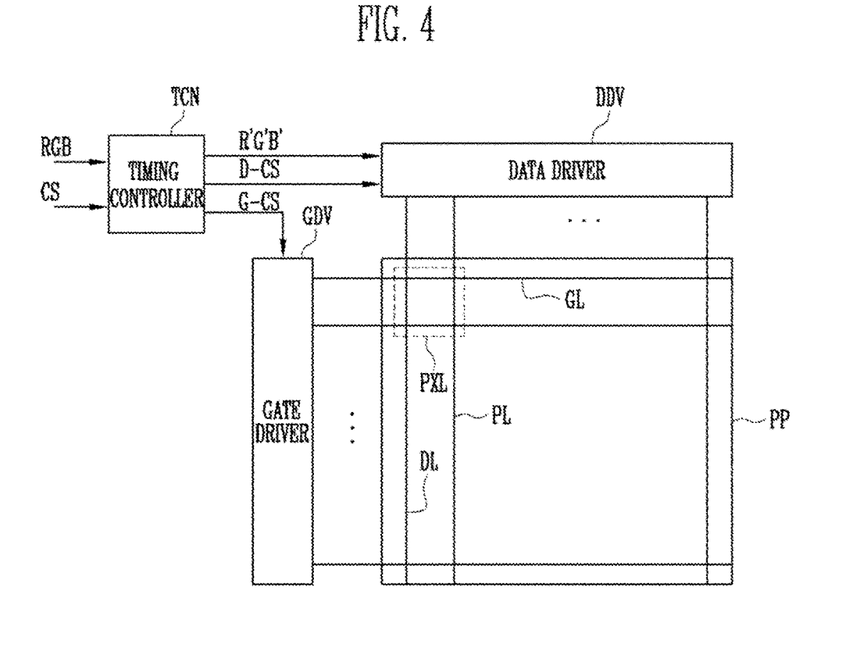
FIG. 4 is a block diagram illustrating a case where a light emitting device is implemented as a display device according to an embodiment of the present disclosure.
Figure 5:
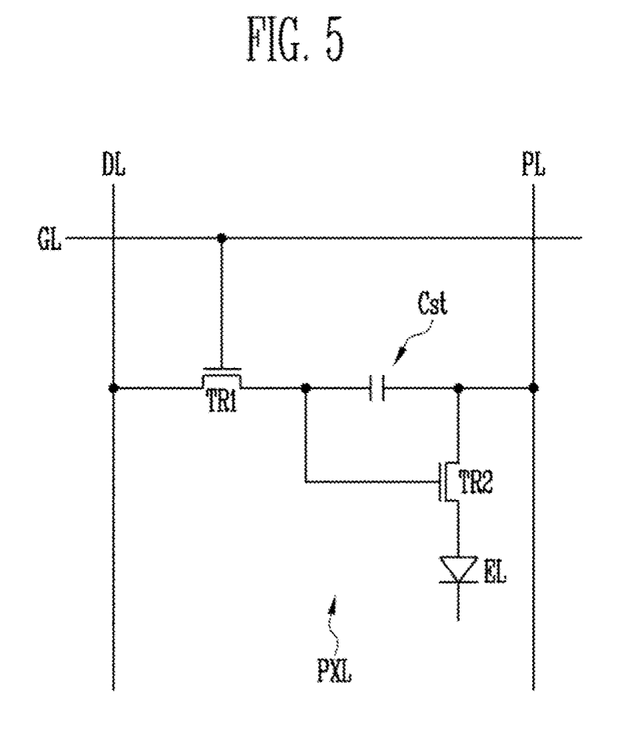
FIG. 5 is a circuit diagram of one pixel in FIG. 4.

FIG. 4 is a block diagram illustrating a case where the light emitting device is implemented as a display device according to an embodiment of the present disclosure. FIG. 5 is a circuit diagram of one pixel in FIG. 4.

Referring to FIGS. 4 and 5, the display device according to the embodiment of the present disclosure includes a display panel PP including a plurality of pixels PXL and a driver. The driver may include a gate driver GVD and a data driver DDV, which drive the pixels PXL, a timing controller TCN that controls driving of the gate driver GVD and the data driver DDV, and the like.

In an embodiment of the present disclosure, it is illustrated that the components of the driver are provided separately from the display panel PP. However, the present disclosure is not limited thereto, and some components of the driver may be provided on the display panel PP. For example, in another embodiment, the gate driver GDV and/or the data driver DDV may be provided on the display panel PP.

Each pixel PXL includes signal lines including a gate line GL, a data line DL, a first power line PL, and a second power line (not shown), a thin film transistor connected to the thin film transistor, a light emitting part EL, and a capacitor Cst.

The gate line GL transmits a gate signal to the thin film transistor, the data line DL transmits a data signal to the thin film transistor, and the first power line PL provides a first power source to the thin film transistor.

The thin film transistor may include a second thin film transistor TR2 for controlling the light emitting part EL and a first thin film transistor TR1 for switching the second thin film transistor TR2. In an embodiment of the present disclosure, it is illustrated that one pixel PXL includes two thin film transistors TR1 and TR2. However, the present disclosure is not limited thereto, and one thin film transistor and one capacitor may be provided in the one pixel PXL, or three or more thin film transistors and two or more capacitors may be provided in the one pixel PXL.

The first thin film transistor TR1 includes a first gate electrode, a first source electrode, and a first drain electrode. The first gate electrode is connected to the gate line GL, and the first source electrode is connected to the data line DL. The first to thin film transistor TR1 transmits, to the second thin film transistor TR2, a data signal applied to the data line DL according to a gate signal applied to the gate line GL.

The second thin film transistor TR2 includes a second gate electrode, a second source electrode, and a second drain electrode. The second gate electrode is connected to the first drain electrode of the first thin film transistor TR1, and the second source electrode is connected to the first power line PL, and the second drain electrode is connected to the light emitting part EL.

The light emitting part EL has first and second electrodes. The first electrode is connected to the second drain electrode of the second thin film transistor TR2. A second power source is applied to the second electrode of the light emitting part EL through the second power line (not shown). As the light emitting part EL emits or does not emit light according to an output signal of the second thin film transistor TR2, the light is emitted or is not emitted, thereby displaying an image. Here, the light emitted from the light emitting part EL may be white light or colored light.

The capacitor Cst may be connected between the second gate electrode and the source electrode of the second thin film transistor TR2. The capacitor Cst charges and maintains a data signal input to the second gate electrode of the second thin film transistor TR2.

The timing controller TCN receives a plurality of image signals RGB and a plurality of control signals CS from the outside of the display device. The timing controller TCN converts a data format of the image signals RGB to meet interface specifications with the data driver DDV, and provides the converted image signals R'G'B' to the data driver DDV. Also, the timing controller TCN generates a data control signal D-CS (e.g., an output start signal, a horizontal start signal, etc.) and a gate control signal G-CS (e.g., a vertical start signal, a vertical clock signal, and a vertical clock bar signal), based on the plurality of control signals CS. The data control signal D-CS is provided to the data driver DDV, and the gate control signal G-CS is provided to the gate driver GDV.

The gate driver GDP sequentially outputs a gate signal in response to the gate control signal G-CS provided from the timing controller TCN. Thus, the plurality of pixels PXL can be sequentially scanned in units of rows by the gate signal.

The data driver DDV converts the image signals R'G'B' into data signals in response to the data control signal D-CS provided from the timing controller TCN and outputs the converted data signals. The output data signals are applied to the pixels PXL.

Thus, each pixel PXL is turned on by the gate signal, and the turned-on pixel PXL receives a corresponding data voltage from the data driver DDV, thereby displaying an image having a desired gray level.

Figure 6A:
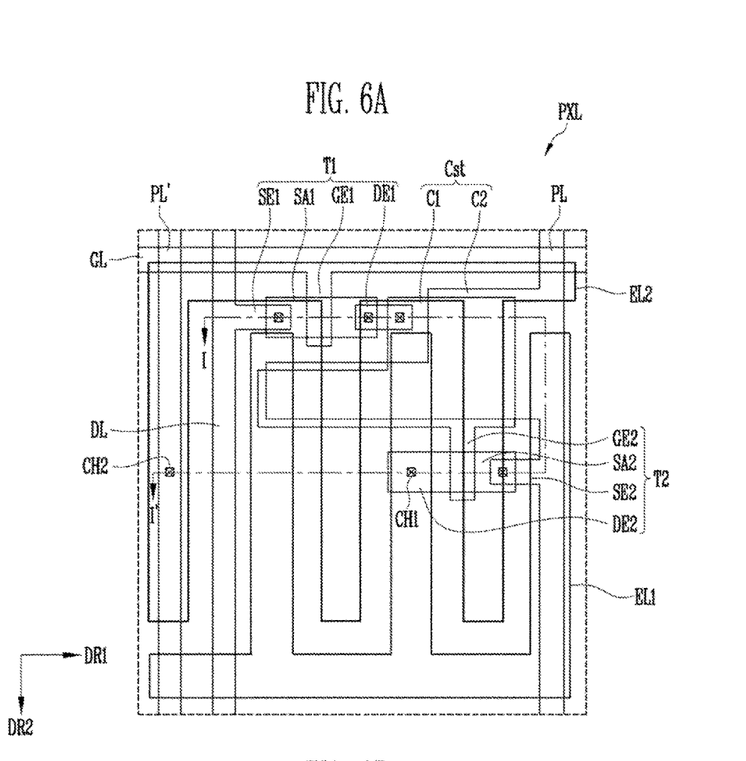
FIG. 6A is a plan view illustrating one pixel in a display of a light emitting device according to an embodiment of the present disclosure.
Figure 6B:
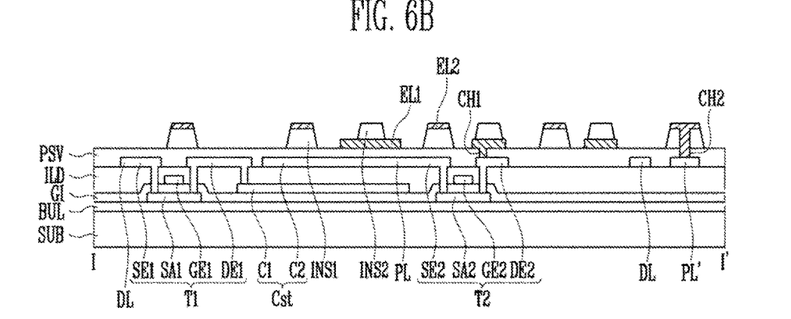
FIG. 6B is a sectional view taken along line I-I' of FIG. 6A.

FIG. 6A is a plan view illustrating one pixel in the display panel of the light emitting device according to an embodiment of the present disclosure, in which the pixel of FIG. 5 is implemented in detail. FIG. 6B is a sectional view taken along line I-I' of FIG. 6A.

Referring to FIGS. 4, 5, 6A, and 6B the display panel PP includes a substrate SUB and pixels PXL provided on the substrate SUB.

Each of the pixels PXL displays an image, and may be provided in plural numbers to be arranged in a matrix form as described above. Here, it is illustrated that each of the pixels PXL has a rectangular shape. However, the present disclosure is not limited thereto, and each of the pixels PXL may be modified in various shapes. In addition, the pixels PXL may be provided to have different areas. For example, when the pixels PXL are pixels having different colors, the pixels PXL may be provided to have different areas or different shapes for every color.

Each pixel PXL includes signal lines, a thin film transistor connected to the signal lines, a light emitting part EL connected to the thin film transistor, and a capacitor Cst.

The signal lines provides signals to the light emitting part EL, and includes a gate line GL, a data line DL, a first power line PL, and a second power line PL'.

The gate line GL extends in a first direction DR1. The data line DL, the first power line PL, and the second power line PL' may extend in a second direction DR2 intersecting the gate line GL. The gate line GL transmits a scan signal to the thin film transistor, the data line DL transmits a data signal to the thin film transistor, the first power line PL provides a first power source to the thin film transistor, and the second power line PL' provides a second power source to a second electrode EL2.

The gate line GL, the data line DL, the first power line PL, and the second power line PL' may be provided in plural numbers.

The thin film transistor may include a second thin film transistor T2 for controlling the light emitting part EL and a first thin film transistor T1 for switching the second thin film transistor T2.

The first thin film transistor T1 includes a first gate electrode GE1, a first source electrode SE1, and a first drain electrode DE1. The first gate electrode GE1 is connected to the gate line GL, and the first source electrode SE1 is connected to the data line DL. The first drain electrode DE1 is connected to a gate electrode (i.e., a second gate electrode GE2) of the second thin film transistor T2.

The second thin film transistor T2 includes the second gate electrode GE2, a second source electrode SE2, and a second drain electrode DE2. The second gate electrode GE2 is connected to the first thin film transistor T1, the second source electrode SE2 is connected to the first power line PL, and the second drain electrode DE2 is connected to the light emitting part EL.

The light emitting part EL incudes a first electrode EL1, the second electrode EL2, and a bar type LED (not shown). The first electrode EL1 is connected to the second drain electrode DE2 of the second thin film transistor T2.

The capacitor Cst is connected between the second gate electrode GE2 and the second source electrode SE2 of the second thin film transistor T2.

Hereinafter, the display panel according to the embodiment of the present disclosure will be described along a stacking order.

The display panel PP according to the embodiment of the present disclosure includes the substrate SUB on which the thin film transistor and the light emitting part EL are stacked.

A buffer layer BUL is formed on the substrate SUB. The buffer layer BUL prevents impurities from penetrating into the first and second thin film transistors T1 and T2. The buffer layer BUL may be formed of silicon nitride (SiNx), silicon oxide (SiOx), silicon oxynitride (SiOxNy), etc. The buffer layer BUL may be omitted according to material and process conditions of the substrate SUB.

A first semiconductor pattern SA1 and a second semiconductor pattern SA2 are provided on the buffer layer BUL. The first semiconductor pattern SA1 and the second semiconductor pattern SA2 are formed of a semiconductor material. Each of the first semiconductor pattern SA1 and the second semiconductor pattern SA2 includes a source region, a drain region, and a channel region provided between the source region and the drain ration. The first semiconductor pattern SA1 and the second semiconductor pattern SA2 may include silicon doped or undoped with impurities, e.g., poly-silicon or amorphous silicon. The first semiconductor pattern SA1 and the second semiconductor pattern SA2 may be semiconductor patterns made of an oxide semiconductor, etc. In an embodiment of the present disclosure, the channel region is a semiconductor pattern undoped with impurities, and may include an intrinsic semiconductor. The source region and the drain region may be semiconductor patterns doped with impurities. The impurities may include an n-type impurity, a p-type impurity, and impurities such as other metals.

A gate insulating layer GI is provided over the first semiconductor pattern SA1 and the second semiconductor pattern SA2.

The gate line GL, the first gate electrode GE1 connected to the gate line GL, and the second gate electrode GE2 are provided on the gate insulating layer GI. The first gate electrode GE1 and the second gate electrode GE2 are formed to cover regions corresponding to the channel regions of the first semiconductor pattern SA1 and the second semiconductor pattern SA2, respectively.

An interlayer insulating layer ILD is provided on the first and second gate electrodes GE1 and GE2 to cover the first gate electrode GE1 and the second gate electrode GE2.

The data line DL, the first source electrode SE1, the first drain electrode DE1, the second source electrode SE2 the second drain electrode DE2, the first power line PL, and the second power fine PL' are provided on the interlayer insulating layer ILD. The first source electrode SE1 is connected to the data line DL. The first source electrode SE1 and the first drain electrode DE1 are in contact with the source region and the drain region of the first semiconductor pattern SA1 through contact holes formed in the gate insulating laser GI and the interlayer insulating layer ILD. The first power line PL is connected to the second source electrode SE2. The second source electrode SE2 and the second drain electrode DE2 are in contact with the source region and the drain region of the second semiconductor pattern SA2 through contact holes formed in the gate insulating layer GI and the interlayer insulating layer ILD. The second power line PL' is disposed to be spaced apart from the data line DL and the first power line PL. The first power line PL and the second power line PL' may include the same material as the data line DL, and be disposed on the same layer as the data line DL.

Meanwhile, a portion C1 of the second gate electrode GE2 and a portion C2 of the first power line PL form a first capacitor electrode C1 and a second capacitor electrode C2, respectively, and constitute the capacitor Cst with the interlayer insulating layer ILD interposed therebetween. The first capacitor electrode C1 may include the same material as the gate line GL and the gate electrode GE, and be disposed on the same layer as the gate line GL and the gate electrode GE. The second capacitor electrode C2 may include the same material as the data line DL, the first power line PL, the source electrode SE, and the drain electrode DE, and be disposed on the same layer as the data line DL, the first power line PL, the source electrode SE, and the drain electrode DE.

A protective layer PSV is provided over the first source electrode SE1, the first drain electrode DE1, the second source electrode SE2, the second drain electrode DE2, the first power line PL, and the second power line PL'. The protective layer PSV may serve as a protective layer that protects the first and second thin film transistors T1 and T2, and serve as a planarization layer that planarizes top surfaces of the first and second thin film transistors T1 and T2.

The protective layer PSV may include at least one layer. For example, the protective layer PSV may include at least one of an inorganic protective layer and an organic protective layer. For example, the protective layer PSV may include an inorganic protective layer that covers the first thin film transistor T1, the second thin film transistor T2, and the capacitor Cst, and an of organic protective layer disposed on the inorganic protective layer.

The in organic protective layer may include at least one of silicon oxide and silicon nitride. In addition, the organic protective layer may include an organic insulating material that enables light to be transmitted therethrough. For example, the organic protective layer may include at least one of polyacrylate resin, epoxy resin, phenolic resin, polyamide resin, polyimide resin, unsaturated polyester resin, polyphenylene ether resin, polyphenylene sulfide resin, and benzocyclobutene resin.

The first electrode EL1 is provided on the protective layer PSV. The first electrode EL1 is connected to the second drain electrode DE2 of the second thin film transistor T2 through a first contact hole CH1 formed in the protective layer PSV.

A first insulating layer INS1 spaced apart from the first electrode EL1 is provided in the region in which the first electrode EL1 is not formed.

A second insulating layer INS2 is provided on the first electrode EL1.

The second electrode EL2 is provided on the first insulating layer INS1. The second electrode EL2 is connected to the second power line PL' through a second contact hole CH2 formed in the first insulating layer INS1 and the protective layer PSV.

Although not in the drawings, the bar type LED is disposed between the first electrode EL1 and the second electrode EL2, and an encapsulation layer that covers the top surface of the substrate SUB is disposed over the first electrode EL1, the second electrode EL2, and the bar type LED.

Meanwhile, in this embodiment, a case where both of the second thin film transistor T2 and the first thin film transistor T1 are thin film transistors having a top gate structure is described as an example, but the present disclosure is not limited thereto. For example, at least one of the second thin film transistor T2 and the first thin film transistor T1 may be a thin film transistor having a bottom gate structure.

In an embodiment of the present disclosure, the connection structure of the second electrode EL2 and the second power line PL' may be provided differently from the above-described embodiment. In the following embodiment, differences front the above-described contents will be mainly described to avoid redundancy.

Figure 7A:
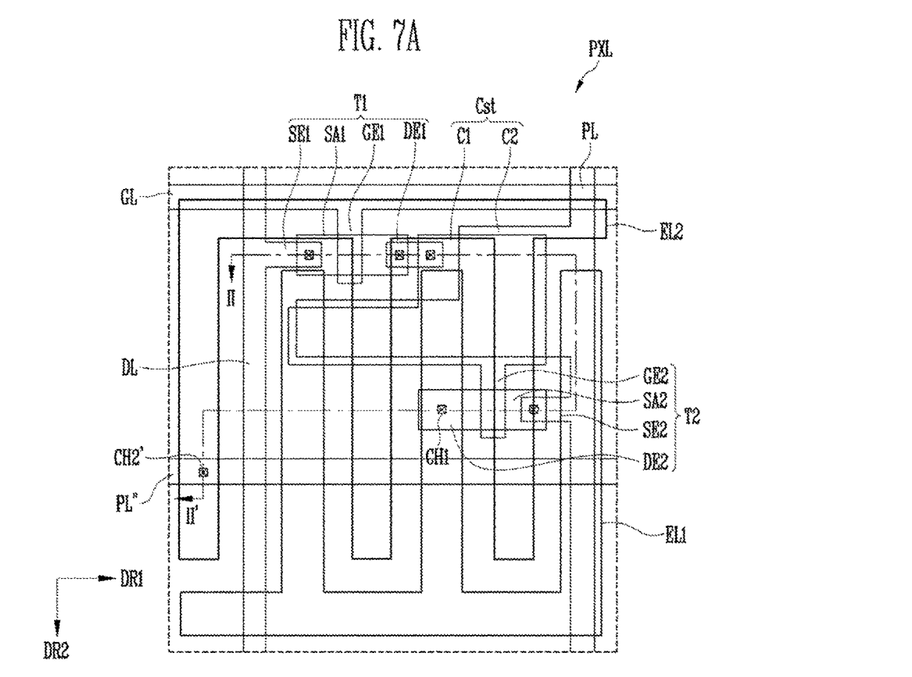
FIG. 7A is a plan view illustrating one pixel in a display of a light emitting device according to an embodiment of the present disclosure.
Figure 7B:
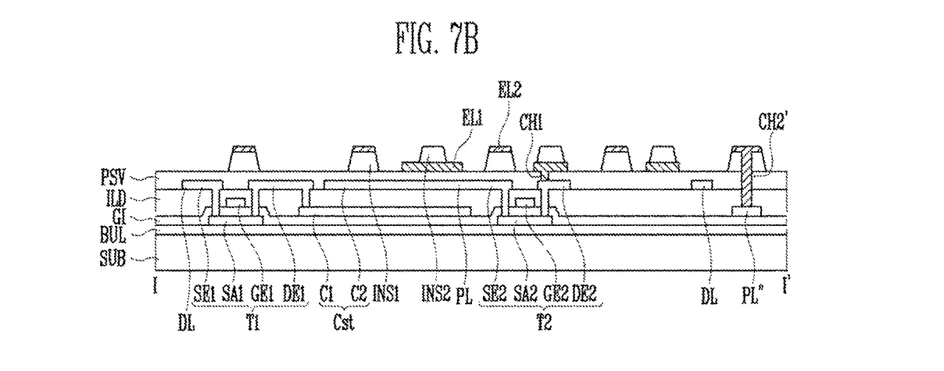
FIG. 7B is a sectional view taken along line II-II' of FIG. 7A.

FIG. 7A is a plan view illustrating one pixel in the display panel of the light emitting device according to an embodiment of the present disclosure, in which the pixel of FIG. 5 is implemented in detail. FIG. 7B is a sectional view taken along line II-II' of FIG. 7A.

Referring to FIGS. 4, 5, 7A and 7B, the display panel PP includes a substrate SUB and pixels PXL provided on the substrate SUB.

Each pixel PXL includes signal lines and a light emitting part EL connected to the signal lines.

The signal lines provide signals to the light emitting part El, and includes a gate line GL, a data line DL, a first power line PL, and a second power line PL".

The gate line GL and the second power line PL" extend in a first direction DR1. The data line DL and the first power line PL may extend in a second direction DR2 intersecting the gate line GL. Here, the second power line PL" may include the same material as the gate line GL, and be disposed on the same layer as the gate line GL.

The display panel PP according to the embodiment of the present disclosure will be described along a stacking order. The display panel PP according to the embodiment of the present disclosure includes the substrate SUB on which thin film transistors and the light emitting part EL are stacked.

A buffer layer BUL is formed on the substrate SUB.

A first semiconductor pattern SA1 and a second semiconductor pattern SA2 are provided on the buffer layer BUL. A gate insulating layer GI is provided on the first semiconductor pattern SA1 and the second semiconductor pattern SA2.

The gate line GL, a first gate electrode GE1 connected to the gate line GL, a second gate electrode GE2, and the second power line PL" spaced apart from the gate line GL are provided on the gate insulating layer GI. The first gate electrode GE1 and the second gate electrode GE2 are formed to cover regions corresponding to channel regions of the first semiconductor pattern SA1 and the second semiconductor pattern SA2, respectively.

An interlayer insulating layer ILD is provided over the first and second gate electrodes GE1 and GE2 to cover the first and second gate electrodes GE1 and GE2.

The data line, a first source electrode SE1, a first drain electrode DE1, a second source electrode SE2, a second drain electrode DE2, and the first power line PL are provided on the interlayer insulating layer ILD. The first power lite PL is connected to the second source electrode SE2.

A protective layer PSV is provided over the first second electrode SE1, the first drain electrode DE1, the second source electrode SE2, the second drain electrode DE2, and the first power ling PL.

A first electrode EL1 is provided on the protective layer PSV. The first electrode EL1 is connected to the second drain electrode DE2 of the second thin film transistor T2 through a first contact hole CH1 formed in the protective layer PSV.

A first insulating layer INS1 spaced apart from the first electrode EL1 is provided in a region in which the first electrode EL1 is not formed.

A second insulating layer INS2 is provided over the first electrode EL1.

A second electrode EL2 is provided on the first insulating layer INS1. The second electrode EL2 is connected to the second power line PL" through a second contact hole CH2' formed in the first insulating layer INS1, the protective layer PSV, and the interlayer insulating layer ILD.

Although not shown in the drawings, a bar type LED is disposed between the first electrode EL1 and the second electrode EL2, and an encapsulation layer that covers the top surface of the substrate SUB is disposed over the first electrode EL1, the second electrode EL2, and the bar type LED.

In the above-described embodiments, a case where the second power line PL' is formed on the same layer as the data line and a case where the second power line PL" is formed on the same layer as the gate line are described, but the present disclosure is not limited thereto. In an embodiment of the present disclosure, the connection structure of the second electrode EL2 and the second power line PL' may be provided differently from the above-described embodiments. For example, although not shown in the drawings, the second power line PL' may be formed of the same material as the semiconductor pattern on the same layer as the semiconductor pattern. In this case, the second electrode EL2 may be connected to the second power line PL' through a contact hole passing through the gate insulating layer GI, the interlayer insulating layer ILD, the protective layer PSV, and the first insulating layer INS1. If necessary, the second electrode EL2 may be connected to the second power line PL' through a bridge electrode additionally disposed on the gate insulating layer GI, the interlayer insulating layer ILD, or the protective layer PSV.

Also, in the above-described embodiments, it is illustrated that the second drain electrode DE2 of the second thin film transistor T2 is connected to the first electrode EL1 and the second power line PL' is connected to the second electrode EL2, but the present disclosure is not limited thereto. In another embodiment of the present disclosure, through various contact structures, the second drain electrode DE2 of the second thin film transistor T2 may be connected to the second electrode EL2, and the second power line PL' may be connected to the first electrode EL1.

The display device according to the embodiment of the present disclosure can be employed in various electronic devices. For example, the display device is applicable to televisions, notebook computers, cellular phones, smart phones, smart pads, PMPs, PDAs, navigations, various wearable devices such as smart watches, and the like.

According to the present disclosure, it is possible to provide a light emitting device capable of improving light emission efficiency.

Also, according to the present disclosure, it is possible to provide a display device having the light emitting device.

Example embodiments have been disclosed herein, and although specific terms are employed, they are used and are to be interpreted in a generic and descriptive sense only and not for purpose of limitation. In some instances, as would be apparent to one of ordinary skill in the art as of the Filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:
1. A light emitting device comprising:
   a substrate;
   a first electrode disposed on the substrate;
   a first insulating layer disposed on the substrate to be spaced apart from the first electrode, the first insulating layer having a first height;
   a second electrode disposed on the first insulating layer; and
   a bar type LED disposed on the substrate,
   wherein the bar type LED has a first end and a second end in the length direction thereof, one of the first end and the second end is connected to the first electrode, and the other of the first end and the second end is connected to the second electrode.

2. The light emitting device of claim 1, further comprising a second insulating layer disposed over the first electrode, wherein the second insulating layer has an area smaller than that of the first electrode in a plan view.

3. The light emitting device of claim 2, wherein the first electrode has a first width and the second insulating layer has a second width narrower than the first width.

4. The light emitting device of claim 3, wherein, in a plan view, the distance between the first electrode and the second electrode is a first distance, and the distance between the second electrode and the second insulating layer is a second distance, the length of the bar type LED is longer than the first distance and is shorter than the second distance.

5. The light emitting device of claim 1, wherein the length direction of the bar type LED is disposed obliquely to one surface of the substrate.

6. The light emitting device of claim 1, wherein, in a plan view, the first electrode and the second electrode have stripe shapes, and are alternatingly disposed to be spaced apart from each other.

7. The light emitting device of claim 1, wherein, in a plan view, the first electrode and the second electrode have ring shapes having concentric circles, and are disposed to be spaced apart from each other.

8. The light emitting device of claim 1, further comprising an encapsulation layer disposed on the substrate to fix the bar type LED.

9. The light emitting device of claim 1, further comprising:
   a gate line disposed on the substrate, the gate line extending in a first direction;
   a data line disposed on the substrate, the data line extending in a second direction intersecting the first direction;
   a first power line extending in the first direction or the second direction; and
   a thin film transistor connected to the gate line, the data line, and the first power line,
   wherein a drain electrode of the thin film transistor is connected to one of the first electrode and the second electrode.

10. The light emitting device of claim 9, further comprising a second power line connected to the other of the first electrode and the second electrode, the second power line extending in the second direction.

11. The light emitting device of claim 10, wherein the second power line is disposed on the same layer as the data line, and includes the same material as the data line.

12. The light emitting device of claim 9, further comprising a second power line connected to the other of the first electrode and the second electrode, the second power line extending in the first direction.

13. The light emitting device of claim 12, wherein the second power line is disposed on the same layer as the gate line, and includes the same material as the gate line.

14. The light emitting device of claim 9, wherein the thin film transistor includes:
  a semiconductor pattern disposed on the substrate;
  a gate electrode disposed on the semiconductor pattern; and
  source and drain electrodes disposed on the gate electrode, the source and drain electrodes each being connected to the semiconductor pattern,
  wherein the first electrode is connected to the drain electrode.

15. The light emitting device of claim 14, further comprising a second power line connected to the other of the first electrode and the second electrode, the second power line extending in the first direction or the second direction,
  wherein the second power line is disposed on the same layer as the semiconductor pattern, and includes the same material as the semiconductor pattern.

16. A light emitting device comprising:
  a first electrode disposed on a substrate;
  a first insulating layer spaced apart from the first electrode in a plan view;
  a second insulating layer disposed over the first electrode;
  a second electrode disposed on the first insulating layer; and
  bar type LEDs scattered on the substrate.

17. A method of manufacturing a light emitting device, the method comprising:
  forming a first electrode on a substrate;
  forming a first insulating layer spaced apart from the first electrode in a plan view, a second insulating layer disposed over the first electrode and a second electrode disposed on the first insulating layer;
  applying an electric field between the first electrode and the second electrode; and
  scattering bar type LEDs on the substrate.

18. The method of claim 17, wherein the first insulating layer and the second insulating layer are formed in a single process.

19. The method of claim 17, wherein the applying of the electric field and the scattering of the bar type LEDs are simultaneously performed.

20. The method of claim 17, further comprising forming an encapsulation layer disposed on the substrate to fix the bar type LEDs.

* * * * *